(12) United States Patent
Lorenzo-Luaces et al.

(10) Patent No.: US 6,617,990 B1
(45) Date of Patent: Sep. 9, 2003

(54) DIGITAL-TO-ANALOG CONVERTER USING PSEUDO-RANDOM SEQUENCES AND A METHOD FOR USING THE SAME

(75) Inventors: Eduardo Lorenzo-Luaces, Altamonte Springs, FL (US); Pertti O. Alapuranen, Indiatlantic, FL (US); Guénaël T. Strutt, Lake Worth, FL (US)

(73) Assignee: Meshnetworks, Maitland, FL (US)

( * ) Notice: Subject to any disclaimer, the term of this patent is extended or adjusted under 35 U.S.C. 154(b) by 0 days.

(21) Appl. No.: 10/091,032

(22) Filed: Mar. 6, 2002

(51) Int. Cl.⁷ .................................................. H03M 1/66
(52) U.S. Cl. ........................................ 341/144; 341/120
(58) Field of Search ................................ 341/144, 118, 341/120; 395/267

(56) References Cited

U.S. PATENT DOCUMENTS

| | | | |
|---|---|---|---|
| 4,494,192 A | 1/1985 | Lew et al. | 364/200 |
| 4,617,656 A | 10/1986 | Kobayashi et al. | 370/74 |
| 4,736,371 A | 4/1988 | Tejima et al. | 370/95 |
| 4,742,357 A | 5/1988 | Rackley | 342/457 |
| 4,747,130 A | 5/1988 | Ho | 379/269 |
| 4,910,521 A | 3/1990 | Mellon | 342/45 |
| 5,034,961 A | 7/1991 | Adams | 375/130 |
| 5,068,916 A | 11/1991 | Harrison et al. | 455/39 |
| 5,231,634 A | 7/1993 | Giles et al. | 370/95.1 |
| 5,233,604 A | 8/1993 | Ahmadi et al. | 370/60 |
| 5,241,542 A | 8/1993 | Natarajan et al. | 370/95.3 |
| 5,305,004 A * | 4/1994 | Fattaruso | 341/120 |
| 5,317,566 A | 5/1994 | Joshi | 370/60 |
| 5,392,450 A | 2/1995 | Nossen | 455/12.1 |
| 5,404,142 A * | 4/1995 | Adams et al. | 341/144 |
| 5,412,654 A | 5/1995 | Perkins | 370/94.1 |
| 5,424,747 A | 6/1995 | Chazelas | 342/70 |
| 5,502,722 A | 3/1996 | Fulghum | 370/69.1 |

(List continued on next page.)

FOREIGN PATENT DOCUMENTS

| | | |
|---|---|---|
| CA | 2132180 | 3/1996 |
| EP | 0513841 A2 | 11/1992 |
| EP | 0627827 A2 | 12/1994 |
| EP | 0924890 A2 | 6/1999 |
| FR | 2683326 | 7/1993 |
| WO | WO 9608884 | 3/1996 |
| WO | WO 9724005 | 7/1997 |
| WO | WO 9839936 | 9/1998 |

(List continued on next page.)

OTHER PUBLICATIONS

Wong et al., "Soft Handoffs in CDMA Mobile Systems", Dec. 1997, IEEE Personal Communications.

Wong et al., "A Pattern Recognition System for Handoff Algorithms", Jul. 2000, IEEE Journal on Selected Areas in Communications, vol. 18, No. 7.

Andras G. Valko, "Cellular IP: A New Approach to Internet Host Mobility", Jan. 1999, ACM Computer Communication Review.

Richard North, Dale Bryan and Dennis Baker, "Wireless Networked Radios: Comparison of Military, Commercial, and R&D Protocols", Feb. 25–Mar. 3, 1999, 2$^{nd}$ annual UCSD Conference on Wireless Communications, San Diego CA.

(List continued on next page.)

*Primary Examiner*—Peguy JeanPierre
*Assistant Examiner*—Joseph Lauture
(74) *Attorney, Agent, or Firm*—Roylance, Abrams, Berdo & Goodman, LLP; Joseph J. Buczynski

(57) ABSTRACT

A system and method for providing discrete analog voltage levels. The system and method employs a pseudo-random sequence generator for generating random-sequences of binary values, namely zeros and ones, based on a digital input. The pseudo-random sequence serves to modulate a current source whose output is integrated to develop a constant discrete analog voltage output. This method reduces spurious frequency interference on the circuit. The system and method can be employed in a node of a wireless ad-hoc communications network.

26 Claims, 1 Drawing Sheet

U.S. PATENT DOCUMENTS

| | | | |
|---|---|---|---|
| 5,504,835 A * | 4/1996 | Yoshikawa et al. | 395/267 |
| 5,517,491 A | 5/1996 | Nanni et al. | 370/29 |
| 5,555,425 A | 9/1996 | Zeller et al. | 395/800 |
| 5,555,540 A | 9/1996 | Radke | 370/16.1 |
| 5,572,528 A | 11/1996 | Shuen | 370/85.13 |
| 5,615,212 A | 3/1997 | Ruszczyk et al. | 370/433 |
| 5,618,045 A | 4/1997 | Kagan et al. | 463/40 |
| 5,621,732 A | 4/1997 | Osawa | 370/79 |
| 5,623,495 A | 4/1997 | Eng et al. | 370/397 |
| 5,627,976 A | 5/1997 | McFarland et al. | 395/308 |
| 5,631,897 A | 5/1997 | Pacheco et al. | 370/237 |
| 5,634,085 A * | 5/1997 | Yoshikawa et al. | 395/2.75 |
| 5,644,576 A | 7/1997 | Bauchot et al. | 370/437 |
| 5,652,751 A | 7/1997 | Sharony | 370/227 |
| 5,680,392 A | 10/1997 | Semaan | 370/261 |
| 5,684,794 A | 11/1997 | Lopez et al. | 370/337 |
| 5,687,194 A | 11/1997 | Paneth et al. | 375/283 |
| 5,696,903 A | 12/1997 | Mahany | 395/200.58 |
| 5,701,294 A | 12/1997 | Ward et al. | 370/252 |
| 5,706,428 A | 1/1998 | Boer et al. | 395/200 |
| 5,717,689 A | 2/1998 | Ayanoglu | 370/349 |
| 5,745,483 A | 4/1998 | Nakagawa et al. | 370/335 |
| 5,774,876 A | 6/1998 | Woolley et al. | 705/28 |
| 5,781,540 A | 7/1998 | Malcolm et al. | 370/321 |
| 5,787,080 A | 7/1998 | Hulyalkar et al. | 370/348 |
| 5,794,154 A | 8/1998 | Bar-On et al. | 455/509 |
| 5,796,732 A | 8/1998 | Mazzola et al. | 370/362 |
| 5,796,741 A | 8/1998 | Saito et al. | 370/439 |
| 5,805,593 A | 9/1998 | Busche | 370/396 |
| 5,805,842 A | 9/1998 | Nagaraj et al. | 395/306 |
| 5,805,977 A | 9/1998 | Hill et al. | 455/31.3 |
| 5,809,518 A | 9/1998 | Lee | 711/115 |
| 5,822,309 A | 10/1998 | Ayanoglu et al. | 370/315 |
| 5,844,905 A | 12/1998 | McKay et al. | 370/443 |
| 5,845,097 A | 12/1998 | Kang et al. | 395/297 |
| 5,857,084 A | 1/1999 | Klein | 395/309 |
| 5,870,350 A | 2/1999 | Bertin et al. | 365/233 |
| 5,877,724 A | 3/1999 | Davis | 342/357 |
| 5,881,095 A | 3/1999 | Cadd | 375/202 |
| 5,881,372 A | 3/1999 | Kruys | 455/113 |
| 5,886,992 A | 3/1999 | Raatikainen et al. | 370/410 |
| 5,896,561 A | 4/1999 | Schrader et al. | 455/67.1 |
| 5,903,559 A | 5/1999 | Acharya et al. | 370/355 |
| 5,909,651 A | 6/1999 | Chander et al. | 455/466 |
| 5,936,953 A | 8/1999 | Simmons | 370/364 |
| 5,943,322 A | 8/1999 | Mayor et al. | 370/280 |
| 5,987,011 A | 11/1999 | Toh | 370/331 |
| 5,987,033 A | 11/1999 | Boer et al. | 370/445 |
| 5,991,279 A | 11/1999 | Haugli et al. | 370/311 |
| 6,028,853 A | 2/2000 | Haartsen | 370/338 |
| 6,029,217 A | 2/2000 | Arimilli et al. | 710/107 |
| 6,034,542 A | 3/2000 | Ridgeway | 326/39 |
| 6,044,062 A | 3/2000 | Brownrigg et al. | 370/238 |
| 6,047,330 A | 4/2000 | Stracke, Jr. | 709/238 |
| 6,052,594 A | 4/2000 | Chuang et al. | 455/450 |
| 6,052,752 A | 4/2000 | Kwon | 710/126 |
| 6,064,626 A | 5/2000 | Stevens | 365/233 |
| 6,067,291 A | 5/2000 | Kamerman et al. | 370/338 |
| 6,078,566 A | 6/2000 | Kikinis | 370/286 |
| 6,104,712 A | 8/2000 | Robert et al. | 370/389 |
| 6,108,738 A | 8/2000 | Chambers et al. | 710/113 |
| 6,115,580 A | 9/2000 | Chuprun et al. | 455/1 |
| 6,122,690 A | 9/2000 | Nannetti et al. | 710/102 |
| 6,130,881 A | 10/2000 | Stiller et al. | 370/238 |
| 6,132,306 A | 10/2000 | Trompower | 453/11.1 |
| 6,147,975 A | 11/2000 | Bowman-Amuah | 370/252 |
| 6,163,699 A | 12/2000 | Naor et al. | 455/453 |
| 6,178,337 B1 | 1/2001 | Spartz et al. | 455/561 |
| 6,192,053 B1 | 2/2001 | Angelico et al. | 370/448 |
| 6,192,230 B1 | 2/2001 | Van Bokhorst et al. | 455/343 |
| 6,208,870 B1 | 3/2001 | Lorello et al. | 455/466 |
| 6,223,240 B1 | 4/2001 | Odenwald et al. | 710/129 |
| 6,240,294 B1 | 5/2001 | Hamilton et al. | 455/456 |
| 6,246,875 B1 | 6/2001 | Seazholtz et al. | 455/432 |
| 6,249,516 B1 | 6/2001 | Brownrigg et al. | 370/338 |
| 6,275,707 B1 | 8/2001 | Reed et al. | 455/456 |
| 6,285,892 B1 | 9/2001 | Hulyalkar | 455/574 |
| 6,304,556 B1 | 10/2001 | Haas | 370/254 |
| 6,327,300 B1 | 12/2001 | Souissi et al. | 375/219 |
| 6,349,091 B1 | 2/2002 | Li | 370/238 |
| 6,349,210 B1 | 2/2002 | Li | 455/450 |
| 2001/0053699 A1 | 12/2001 | McCrady et al. | 455/513 |

FOREIGN PATENT DOCUMENTS

| | | |
|---|---|---|
| WO | WO 9912302 | 3/1999 |
| WO | WO 0034932 | 6/2000 |
| WO | WO 0110154 | 2/2001 |
| WO | WO 0133770 | 5/2001 |
| WO | WO 0135567 | 5/2001 |
| WO | WO 0137481 | 5/2001 |
| WO | WO 0137482 | 5/2001 |
| WO | WO 0137483 | 5/2001 |
| WO | WO 0235253 | 5/2002 |

OTHER PUBLICATIONS

Benjamin B. Peterson, Chris Kmiecik, Richard Hartnett, Patrick M. Thompson, Jose Mendoza and Hung Nguyen, "Spread Spectrum Indoor Geolocation", Aug. 1998, Navigation: Journal of the Institute of Navigation, vol. 45, No. 2, summer 1998.

Josh Broch, David A. Maltz, David B. Johnson, Yih–Chun Hu and Jorjeta Jetcheva, "A Performance Comparison of Multi–Hop Wireless Ad Hoc Network Routing Protocols", Oct. 25–30, 1998, Proceedings of the 4th Annual ACM/IEEE International Conference on Mobile Computing and Networking.

C. David Young, "USAP: A Unifying Dynamic Distributed Multichannel TDMA Slot Assignment Protocol", No date.

Chip Elliott and Bob Heile, "Self–Organizing, Self–Healing Wireless Networks", 2000 IEEE.

J.J. Garcia–Luna–Aceves and Asimakis Tzamaloukas, "Reversing the Collision–Avoidance Handshake in Wireless Networks", No date.

J.J. Garcia–Luna–Aceves and Marcelo Spohn, "Transmission–Efficient Routing in Wireless Networks Using Link–State Information", No date.

J.J. Garcia–Luna–Aceves and Ewerton L. Madruga, "The Core–Assisted Mesh Protocol", Aug. 1999, IEEE Journal on Selected Areas in Communications, vol. 17, No. 8, Aug. 1999.

Ad Kamerman and Guido Aben, "Net Throughput with IEEE 802.11 Wireless LANs", No date.

J.R. McChesney and R.J. Saulitis, "Optimization of an Adaptive Link Control Protocol for Multimedia Packet Radio Networks", No date.

Ram Ramanathan and Regina Rosales–Hain, "Topology Control of Multihop Wireless Networks using Transmit Power Adjustment", No date.

Ram Ramanathan and Martha E. Steenstrup, "Hierarchically-Organized, Multihop Mobile Wireless Networks for Quality–of–Service Support", No date.

Martha E. Steenstrup, "Dynamic Multipoint Virtual Circuits for Multimedia Traffic in Multihop Mobile Wireless Networks", No date.

Zhenyu Tang and J.J. Garcia–Luna–Aceves, "Collision–Avoidance Transmission Scheduling for Ad–Hoc Networks", No date.

George Vardakas and Wendell Kishaba, "QoS Networking With Adaptive Link Control and Tactical Multi–Channel Software Radios", No date.

* cited by examiner

DIGITAL-TO-ANALOG CONVERTER USING PSEUDO-RANDOM SEQUENCES AND A METHOD FOR USING THE SAME

BACKGROUND OF THE INVENTION

1. Field of the Invention

The present invention relates to a system and method which principally employs pseudo-random binary sequence with known bias to generate discrete analog voltage levels. More particularly, the present invention relates to an apparatus and method for providing respective discrete analog voltage levels by modulating a current source with a pseudo-random binary sequence, the output of which being integrated over time to develop discrete and precise analog voltage levels.

2. Description of the Related Art

Many times, electronic systems require static analog voltage levels for tuning and control of the various subsystems. Moreover, it is acceptable for the required analog voltage levels to be chosen from a discrete set of levels. A very popular choice among electronic system designers for developing discrete voltage levels is through the use of analog to digital converters (DAC) where a digital binary word defines the discrete analog voltage level that is developed at the output of the device.

Many different techniques are employed to develop discrete analog levels from digital binary words. Among these are successive approximation registers (SARs), flash, and delta-sigma techniques. However, as can be appreciated by one skilled in the art, most of these DAC implementations are extremely sophisticated and complex, making them expensive and large in comparison to the cost and size of the other components in the system. In certain applications, therefore, it is desirable to have a very low complexity DAC to maintain a reasonable system cost. Moreover, it is desirable to have a DAC which is very amenable to integration into low-cost digital integrated circuits (ICs).

Accordingly, a need exists for a simple and inexpensive system and method for providing discrete analog voltage levels from within a digital IC employing a minimal complexity technique.

SUMMARY OF THE INVENTION

An object of the present invention is to provide a system and method capable of providing an analog voltage level from a set of discrete levels selected by a digital control word and employing a low complexity technique for this function.

Another object of the present invention is to reduce system costs through the use of existing digital logic component resource on a circuit board, namely, application specific ICs (ASIC) or programmable logic devices (PLD), to provide the discrete analog voltage levels via the addition of a minimal number of external analog components.

These and other objects are substantially achieved by a system and method for providing discrete analog voltage levels. The system and method employs a digitally programmable pseudo-random sequence generator for generating finite length, repetitive, sequences of binary values, namely zeros and ones, which have varying degrees of bias. The bias of a binary sequence is defined by the formula Bias=(None−Nzero)/(2*(None+Nzero))

Where "None" equals the total number of ones in the binary sequence and "Nzero" equals total number of zeros in the binary sequence.

From this formula, it is evident that a binary sequence with an equal number of zeros and ones has a bias of zero. Such a sequence is said to be perfectly balanced. If a sequence has more ones than zeros, then it will have a positive bias. In the same manner, sequences with more zeros than ones have a negative bias. Polarity keying a constant valued current source with the pseudo-random, repetitive sequence with know bias, and then integrating the output of the current source through a capacitor, transforms the bias of the binary sequence into an appropriately scaled precise discrete analog voltage. The current source modulation time interval, as well as the integrating capacitor value, shall be chosen so as to minimize undesirable fluctuations in the final output voltage. Specifically, the ratio of the constant current source value to the integrating capacitor in this example is at least one-twentieth the modulation time interval.

BRIEF DESCRIPTION OF THE DRAWINGS

These and other objects, advantages and novel features of the invention will be more readily appreciated from the following detailed description when read in conjunction with the accompanying drawings, in which.

DETAILED DESCRIPTION OF THE PREFERRED EMBODIMENTS

Figure 1:
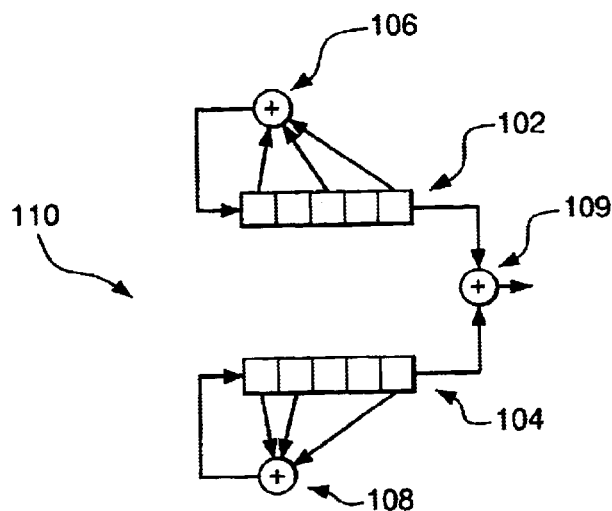
FIG. 1 is a block diagram of two exemplary shift registers for generating pseudo-random binary sequences in accordance with an embodiment of the present invention.

FIG. 1 is a block diagram illustrating a PN generator 110 employing two shift registers 102 and 104, respectively, for generating pseudo-random binary sequences in accordance with an embodiment of the present invention. Feedback taps from the first register 102 are summed in a modulo-2 adder 106, and fed back to the shift register input creating a linear feedback shift register (LFSR). The second register 104 is connected in a similar manner to a modulo-2 adder 108. The output of both registers is connected to a common modulo-2 adder 109, whose output is the output of the PN generator 110.

In a preferred embodiment of the present invention, each of the shift registers 102 and 104 has a length of five. In this example, shift registers 102 and 104 have feedback polynomials [u] o45=$1+D^2+D^4+D^5$ and [v] o71=$1+D^3+D^4+D^5$, respectively. However, as can be appreciated by one skilled in the art, each shift register 102 and 104 can have any suitable length and/or other feedback polynomials in order to generate the desired number of PN sequences having the desired length.

The PN sequence generator 110 generates random-binary sequences. The reason pseudo-random (PN) sequences are used instead of any stream of zeros and ones is to minimize unwanted discrete spurious frequencies in a circuit. Indeed, pseudo-random sequences substantially guarantee that the signal generated at the output of the binary device is wideband, thus limiting discrete spurious frequency interference.

Table 1 below shows a set of 31-chip sequences generated by the PN generator 110 shown in FIG. 1 to be used to achieve an 18-level DAC. The values indicated in the columns "Init [u]" and "Init [v]" represent the hexadecimal seeds that are loaded into the shift registers 102 and 104 to produce the respective binary sequence shown in the "Sequence" column. For example, when the hexadecimal values "A" and "12", corresponding to binary values "01010" and "10010" are loaded into shift registers 102 and 104, respectively, the PN generator 110 generates the repetitive 31-chip sequence shown in the corresponding "Sequence" column. The number in the "Bias" column are the results of applying the formula $$Bias=(None-Nzero)/(2*(None+Nzero))$$

where "None" equals the total number of ones in the binary sequence and "Nzero" equals total number of zeros in the binary sequence.

It is noted that the initial shift-register seed for each sequence corresponding to a specific bias was determined by selecting, among all possible sequences, with the same bias, the sequence which has the lowest discrete spurious frequency components.

TABLE 1

Examples of 31-Chip Sequences for an 18-Level DAC

| Bias | Init [u] | Init [v] | Sequence |
|---|---|---|---|
| +17/62 | A | 5 | 1111101111001001111110101111111 |
| +15/62 | 1A | 11 | 1101111101111001001111110101111 |
| +13/62 | 7 | 10 | 1101101111111001111111110100100 |
| +11/62 | 15 | 1A | 1101101011001111000101111110111 |
| +9/62 | 2 | 15 | 1110011111111101001001001110101 |
| +7/62 | 11 | 1A | 1111000101111101110010010100011 |
| +5/62 | 7 | D | 0111100010111111011100100101001 |
| +3/62 | 9 | 1 | 0010010111011101010011111000110 |
| +1/62 | 7 | 0 | 1101001000010101110110001111100 |
| −1/62 | 1A | 17 | 1011011110101000100111000001100 |
| −3/62 | C | 18 | 0010010001011101011000100011110 |
| −5/62 | 1A | 1A | 0001110100000010000110110101011001 |
| −7/62 | 9 | 1B | 0111000010001000000110101101100 |
| −9/62 | F | 1A | 1001001010011000011101000000100 |
| −11/62 | 15 | D | 0010010100110000111010000001000 |
| −13/62 | 11 | C | 1001000001000011011000000101000 |
| −15/62 | 14 | 1D | 1000001000011011000000101000000 |
| −17/62 | A | 12 | 0000010000110110000001010000000 |

Figure 2:
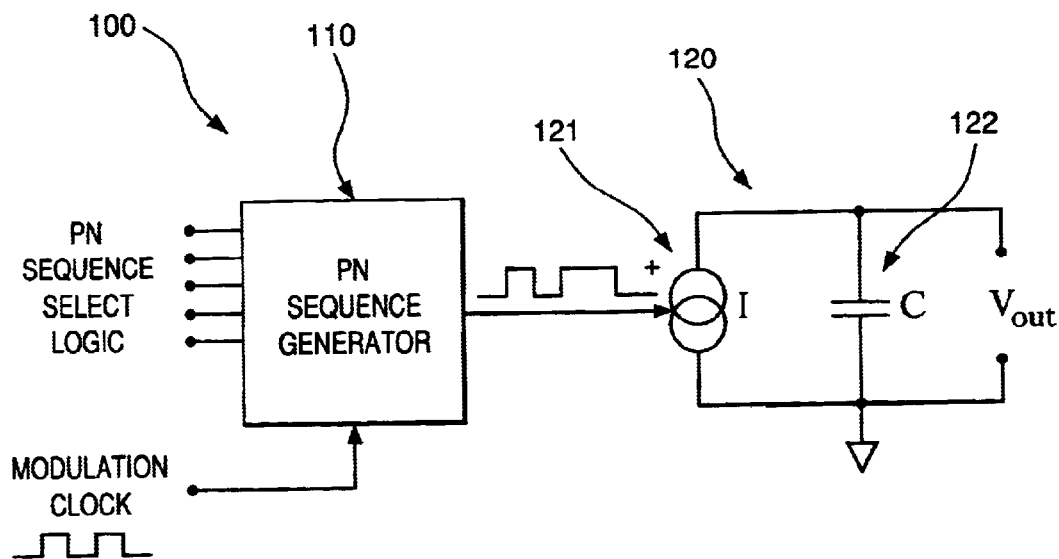
FIG. 2 is a block diagram of a circuit employing the PN sequence generator shown in FIG. 1 to produce discrete analog voltages in accordance with an embodiment of the present invention.

FIG. 2 is a block diagram of a DAC circuit 100 implementing the PN generator 110 shown in FIG. 1 in accordance with an embodiment of the present invention. Specifically, the circuit 100 comprises a PN binary sequence generator 110 and an integrator circuit 120. The PN generator 110 receives control logic digital inputs which select the shift register seeds as discussed above. Additionally, PN generator 110 receives a clock which determines the minimum time interval between transitions of the binary output sequence. This interval is referred to as the modulation time interval. The PN binary sequence modulates current source 121 in such a manner as to produce a positive current pulse of value +I when its modulation input equals a binary one and a negative current pulse of value −I when its modulation input equals a binary zero. The positive and negative current pulses from the current source 121 are integrated by capacitor 122 to develop analog voltage Vout at the output of the integrating circuit 120.

Therefore, in accordance with an embodiment of the present invention, the DAC 100 can be achieved by combining a PN sequence generator 110 with an integrating circuit 120, and by taking the analog output voltage developed across the integrating capacitor 122. The circuit 100 is particularly useful for controlling the transmit power in terminals or nodes of wireless ad-hoc communications networks, such as those described in U.S. Pat. No. 5,943,322 to Mayor, and in U.S. patent application Ser. No. 09/897,790 entitled "Ad Hoc Peer-to-Peer Mobile Radio Access System Interfaced to the PSTN and Cellular Networks", filed on Jun. 29, 2001, in U.S. patent application Ser. No. 09/815,157 entitled "Time Division Protocol for an Ad-Hoc, Peer-to-Peer Radio Network Having Coordinating Channel Access to Shared Parallel Data Channels with Separate Reservation Channel", filed on Mar. 22, 2001, and in U.S. patent application Ser. No. 09/815,164 entitled "Prioritized-Routing for an Ad-Hoc, Peer-to-Peer, Mobile Radio Access System", filed on Mar. 22, 2001, the entire content of said patent and each of said patent applications being incorporated herein by reference.

As can be appreciated by those skilled in the art, the characteristics of the analog voltage output of the integrating circuit 120 will depend on i.) the modulation time interval; ii.) the uniform quantization step in bias between PN sequences; iii.) the value of the current source 121; and iv.) the value of the integrating capacitor 122. Provided that the ratio of the value of the current source 121 to the value of the integrating capacitor 122 times the uniform quantization step in bias is at least one-tenth (or at least approximately one-tenth) the value of the modulation time interval, the value of the analog voltage output of the integrating circuit 120 is determined by the bias of the selected PN sequence scaled by the value of the current source 121 plus the initial voltage across the integrating capacitor 122. Typically, this initial voltage is chosen to be zero; hence, the output voltage of the integrating circuit 120 is a function of the PN sequence's bias and the value of the current source 122.

As demonstrated above, the circuit 100, after only a minimal number of clocking periods upon initialization, develops a steady analog voltage at the output of the integrating circuit whose value can be adjusted by digitally selecting a PN sequence with the respective bias. In the example described above, the PN generator 110 is used to generate 18 bias values. However, the sizes of the shift registers 102 and 104 can be increased or decreased to increase or decrease the number of bias values or to change the uniform bias quantization step.

Although only a few exemplary embodiments of the present invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims.

What is claimed is:

1. A system for providing at least one analog voltage level, comprising:

a pseudo-random sequence generator, adapted to generate at least one pseudo-random sequence of binary values; and an integrator, adapted to provide an analog voltage having a value based on a relationship between the values of a plurality of bits of said pseudo-random sequence represented by the following formula:

$$Bias=(None-Nzero)/(2*(None+Nzero))$$

where "None" equals the total number of ones in the binary sequence and "Nzero" equals total number of zeros in the binary sequence.

2. A system as claimed in claim 1, wherein:

said integrator includes a capacitor which is adapted to develop said analog voltage.

3. A system as claimed in claim 1, wherein:

said integrator includes a current source, which is adapted to be modulated by said pseudo-random sequence to produce current pulses from which said analog voltage is produced.

4. A system as claimed in claim 3, wherein:

said integrator further includes a capacitor, which is adapted to develop said analog voltage based on said current pulses.

5. A system as claimed in claim 1, wherein:

said relationship represents a number of a type of binary values in said sequence in relation to a number of another type of binary values in said sequence.

6. A system as claimed in claim 5, wherein:

said type of binary values are high values, and said another type of binary values are low values.

7. A system as claimed in claim 1, wherein:

said pseudo-random sequence generator is adapted to generate a plurality of pseudo-random sequences of binary values; and said integrator is adapted to provide respective analog voltages, each having a respective value based on a respective said relationship between the values of a plurality of bits of each said respective pseudo-random sequence.

8. A system as claimed in claim 1, wherein:

said pseudo-random sequence generator and said integrator are employed in a node of an ad-hoc communications network.

9. A method for providing at least one analog voltage level, comprising:

operating a pseudo-random sequence generator to generate at least one pseudo-random sequence of binary values; and integrating said binary sequence to provide an analog voltage having a value based on a relationship between the values of a plurality of bits of said pseudo-random sequence represented by the following formula:

$$Bias=(None-Nzero)/(2*(None+Nzero))$$

where "None" equals the total number of ones in the binary sequence and "Nzero" equals total number of zeros in the binary sequence.

10. A method as claimed in claim 9, wherein:

said integrating includes modulating a current source by said pseudo-random sequence to produce current pulses from which said analog voltage is produced.

11. A method as claimed in claim 10, wherein:

said integrating further includes inputting said current pulses to a capacitor, which is adapted to develop said analog voltage based on said current pulses.

12. A method as claimed in claim 9, wherein:

said relationship represents a number of a type of binary values in said sequence in relation to another type of binary values in said sequence.

13. A method as claimed in claim 12, wherein:

said type of binary values are high values and said another type of binary values are low values.

14. A method as claimed in claim 9, wherein:

said operating operates said pseudo-random sequence generator to generate a plurality of pseudo-random sequences of binary values; and said integrating provides respective analog voltages, each having a respective value based on a respective said relationship between the values of a plurality of bits of each said respective pseudo-random sequence.

15. A method as claimed in claim 9, wherein:

said operating and integrating are performed in a node of an ad-hoc communications network.

16. A system for providing at least one analog voltage level, comprising:

a pseudo-random sequence generator, adapted to generate at least one pseudo-random sequence of binary values; and an integrator, adapted to provide an analog voltage having a value based on a characteristic of said pseudo-random sequence represented by the following formula:

$$Bias=(None-Nzero)/(2*(None+Nzero))$$

where "None" equals the total number of ones in the binary sequence and "Nzero" equals total number of zeros in the binary sequence.

17. A system as claimed in claim 16, wherein:

said integrator includes a capacitor which is adapted to develop said analog voltage.

18. A system as claimed in claim 16, wherein:

said integrator includes a current source, which is adapted to be modulated by said pseudo-random sequence to produce current pulses from which said analog voltage is produced.

19. A system as claimed in claim 18, wherein:

said integrator further includes a capacitor, which is adapted to develop said analog voltage based on said current pulses.

20. A system as claimed in claim 16, wherein:

said pseudo-random sequence generator is adapted to generate a plurality of pseudo-random sequences of binary values; and said integrator is adapted to provide respective analog voltages, each having a respective value based on a characteristic of each said respective pseudo-random sequence.

21. A system as claimed in claim 16, wherein:

said pseudo-random sequence generator and said integrator are employed in a node of an ad-hoc communications network.

22. A method for providing at least one analog voltage level, comprising:

operating a pseudo-random sequence generator to generate at least one pseudo-random sequence of binary values; and integrating said binary sequence to provide an analog voltage having a value based on a characteristic of said pseudo-random sequence represented by the following formula:

$$Bias=(None-Nzero)/(2*(None+Nzero))$$

where "None" equals the total number of ones in the binary sequence and "Nzero" equals total number of zeros in the binary sequence.

23. A method as claimed in claim 12, wherein:

said integrating includes modulating a current source by said pseudo-random sequence to produce current pulses from which said analog voltage is produced.

24. A method as claimed in claim 23, wherein:

said integrating further includes inputting said current pulses to a capacitor, which is adapted to develop said analog voltage based on said current pulses.

25. A method as claimed in claim 12, wherein:

said operating operates said pseudo-random sequence generator to generate a plurality of pseudo-random sequences of binary values; and said integrating provides respective analog voltages, each having a respective value based on a characteristic of each said respective pseudo-random sequence.

26. A method as claimed in claim 12, wherein:

said operating and integrating are performed in a node of an ad-hoc communications network.

* * * * *